United States Patent [19]

Suzuki

[11] 3,870,961

[45] Mar. 11, 1975

[54] ACTUATING MEANS FOR AFC DEFEAT SWITCH

[75] Inventor: Kazuo Suzuki, Soma, Japan

[73] Assignee: Alps Electric Co., Ltd., Tokyo, Japan

[22] Filed: June 27, 1973

[21] Appl. No.: 373,997

[30] Foreign Application Priority Data

July 7, 1972 Japan .......................... 47-80524[U]

[52] U.S. Cl. ................. 325/457, 325/464, 325/468, 334/52

[51] Int. Cl. ........................... H04b 1/06, H03j 5/02

[58] Field of Search ........... 325/352, 389, 482, 457, 325/418–421, 464, 468; 178/DIG. 15; 334/52; 74/10.41, 10.15

[56] References Cited

UNITED STATES PATENTS

| | | | |
|---|---|---|---|
| 3,166,714 | 1/1965 | Hien | 325/457 |
| 3,328,700 | 6/1967 | Chipman | 325/457 |
| 3,466,549 | 9/1969 | Milnes | 325/457 |
| 3,750,031 | 7/1973 | Mayer et al. | 325/452 |
| 3,798,579 | 3/1974 | Tap | 334/53 |

*Primary Examiner*—Benedict V. Safourek
*Assistant Examiner*—Jin F. Ng

[57] ABSTRACT

In a TV tuner having AFC and having a switch effective when actuated to disable the AFC, a detent member rotatable with the channel selector shaft has raised portions and recesses and resilient means cooperates therewith to produce detent action by riding over the raised portions and into the recesses. There is also a fine tuning means which includes a fine tuning shaft. The AFC defeat switch is provided with an operating lever which is moved to switch-actuating position either by the resilient means as it rides over the raised portions of the detent member or by the fine tuning shaft when the latter is moved to enable the fine tuning means.

1 Claim, 4 Drawing Figures

ACTUATING MEANS FOR AFC DEFEAT SWITCH

BACKGROUND OF THE INVENTION

This invention relates to an improved switch for controlling an AFC circuit asssociaed with a television tuner.

When AFC is provided in a TV tuner, it interferes with obtaining an optimum manual positioning of the tuning elements for tuning a given channel. Accordingly, it has been proposed to provide an AFC defeat switch which, when actuated, will disable the AFC circuit, that defeat switch being actuated whenever manual tuning takes place, thereby to permit that manual tuning to be carried out in an optimum manner, the AFC defeat switch thereafter being deactuated to permit the AFC circuit to perform its desired function of maintaining the proper tuning of the circuit over a period of time. Since tuners often have different operating mechanisms for channel selection (coarse tuning) and for fine tuning respectively, and since it is desired that the AFC circuit be defeated both when channel selection is effected and the fine tuning is effected, means must be provided for actuating the AFC defeat switch when either type of tuning is carried out. These functions have been accomplished in the past, but by relatively complex mechanical interconnections which have maximized the number of parts required and which have unduly increased production cost.

SUMMARY OF THE INVENTION

A primary object of the present invention is to provide an improved AFC defeat switch and associated actuating mechanism which can be easily assembled into a television tuner.

Another object of the present invention is to provide an improved AFC defeat switch which can be operated by either a channel selector shaft or a fine tuning shaft through a minimized number of parts.

Still another object of the invention is to provide a simplified AFC defeat switch operating mechanism effective to perform its AFC defeat task either upon channel selection or fine tuning.

To these ends I use the conventional and pre-existing detent member forming a part of the conventional channel selector mechanism, which imparts thereto a desired step-wise movement from one channel to the next, to act directly on an operating lever for the AFC defeat switch, that same lever also being actuated by a separate connection to the fine tuning shaft. Whenever the resilient means active on the detent member moves from a recess to a raised portion on the detent member, the operating lever is moved from its switch-deactuating position to its switch-actuating position. Similarly, whenever the fine tuning shaft is actuated to enable the fine tuning mechanism, a cam operatively connected thereto moves a part into engagement with the operating lever on the defeat switch, thereby again to move that switch from its deactuating to its actuating position. The operating lever may be mounted rotatably on the channel selector shaft, thus simplifying the construction and reducing the amount of space required therefor. The operating lever for the switch is preferably resiliently bendable and also preferably resiliently twistable, the lever being effective to actuate the switch either when bent or twisted (twisting being a special case of bending), and the lever being twisted and bent respectively by one and the other of the channel selector means and fine tuning means respectively.

To the accomplishment of the above, and to such other objects as may hereinafter appear, the present invention relates to the construction and arrangement of mechanisms for actuating an AFC defeat switch in a TV tuner or the like, as defined in the appended claims and as described in this specification, taken together with the accompanying drawings.

DETAILED DESCRIPTION OF THE INVENTION

Figure 1:
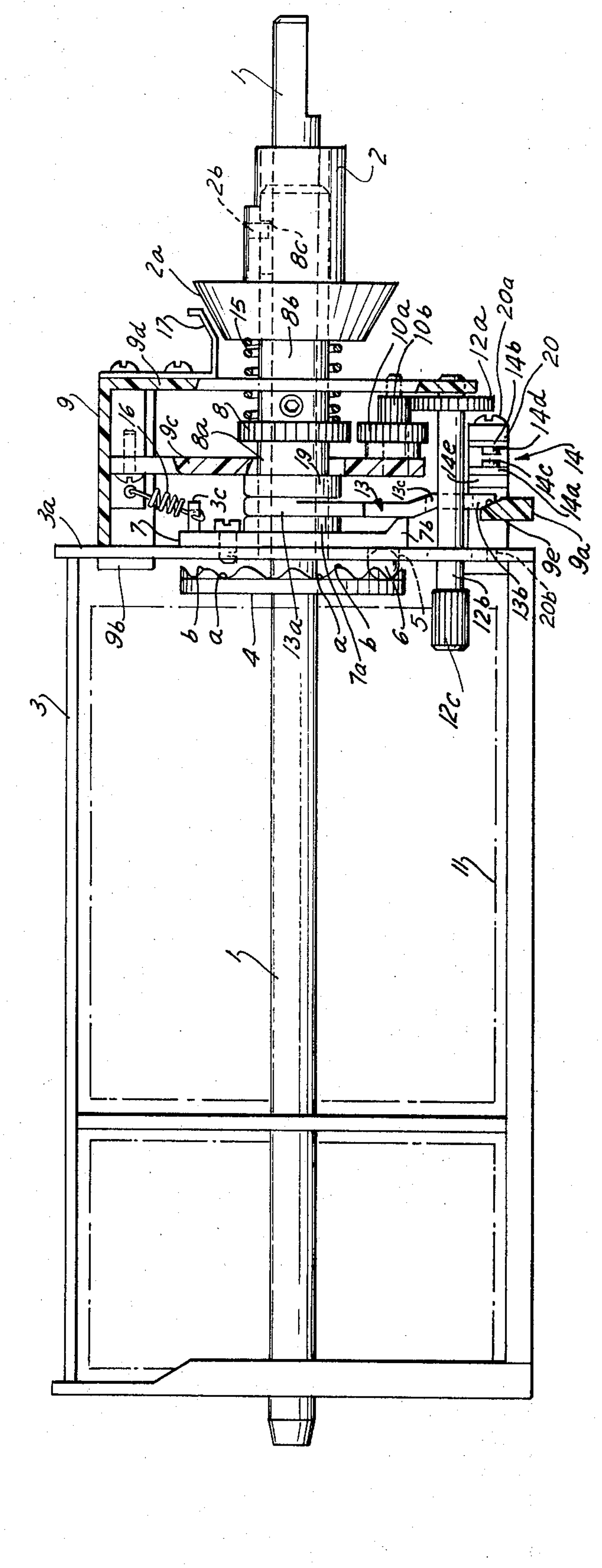
FIG. 1 is a side elevational view showing a television tuner assembled with an AFC defeat switch and actuating mechanism therefor according to the present invention.
Figure 2:
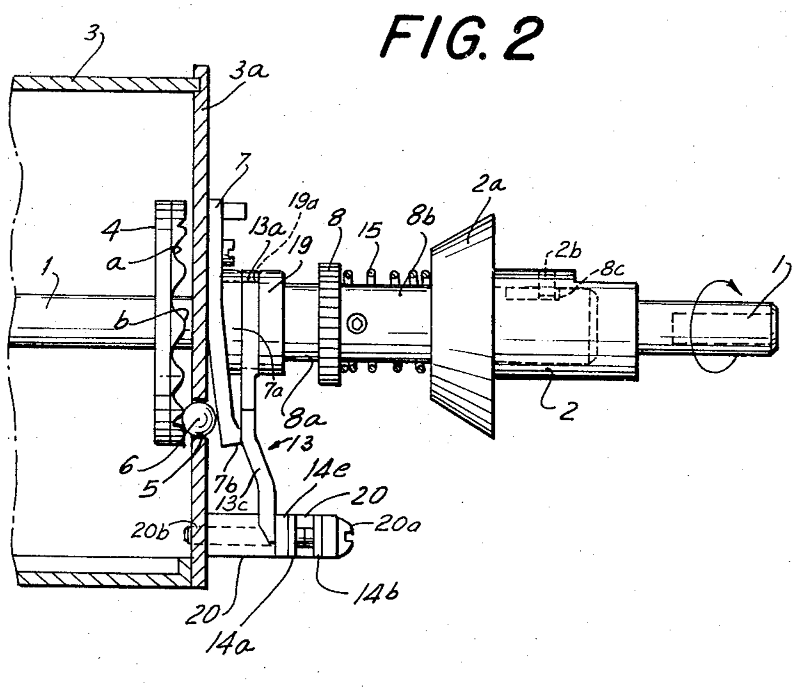
FIG. 2 is a fragmentary elevational view on an enlarged scale showing the AFC defeat switch actuated during channel selection, the mechanism for actuating the AFC defeat switch during fine tuning having been omitted from FIG. 2 for reasons of clarity of illustration.

The television tuner comprises a channel selector shaft 1 and a fine tuning adjustment shaft 2, the latter being of tubular construction co-axially mounted on shaft 1. The channel selector shaft 1 is freely rotatably mounted on frame 3 of the tuner. It carries a detent member 4 having a plurality of recesses *a* and raised portions *b* disposed in a circular path thereon. The detent member 4 is fast on the shaft 1 so as to rotate therewith, and is located adjacent to the end wall 3*a* of the frame 3. Cooperating with the detent member 4 to produce detented rotative positioning of the shaft 1 is a resilient means comprising a resilient plate 7 fixed to the end wall 3*a* and having a hub 7*a* through which the shaft 1 freely passes and having an end portion 7*b* which is located opposite an aperture 5 in the end wall 3*a*, a steel ball 6 being received in the aperture 5 and being pressed by the end portion 7*b* against that portion of the detent element 4 provided with the recesses *a* and raised portions *b*. This will be understood to be a relatively conventional type of detent mechanism, imparting a step-by-step type of movement to the shaft 1 as it rotates together with the detent element 4.

The shaft 1, when turned, is designed to actuate channel selector tuning means 11, the construction and mode of operation of which forms no part of the present invention and which therefore is merely disclosed in block form. Each time that the shaft 1 is rotated to cause the ball 6 to ride into a recess *a* the tuning mechanism 11 will be conditioned to cause the TV set of which it is a part to be tuned to receive a particular broadcasting channel.

The tuning set is provided with an AFC circuit, and a switch 14 is mounted on the frame 3 and is operatively connected to that AFC circuit in any appropriate way, as is conventional, so that the switch 14, when actuated, will defeat or render inoperative the operation of the AFC circuit. In the embodiment here disclosed the switch 14 is constituted by resilient contact arms 14*a* and 14*b* carrying at their ends contacts 14*c* and 14*d* respectively, the switch arms 14*a* and 14*b* being mounted on spacers 20 and secured to the frame 3 by means of a screw 20*a* received in an aperture 20*b* in the end plate 3*a*. The contacts 14*c* and 14*d* are normally separated, and in that position the circuit connections are such that the AFC circuit is effective. However, when the contacts 14*c* and 14*d* are moved into engagement with one another the circuit connections are such that the AFC circuit is rendered inoperative or defeated.

In order to actuate the switch 14 an operating lever 13 is provided, that lever being mounted on the shaft 1, as by having a hub part 13*a* freely rotatably received on the shaft 1, the body of the lever 13 extending down past the end portion 7*b* of the resilient means 7 (which may have an enlargement thereon, as shown, to facilitate operative engagement between the parts), and having an end portion 13*b* offset from the main portion of the lever 13 by a bend 13*c*, the end portion 13*b* extending down to a position close to and just to the left of switch arm 14*a*, which latter may be provided with a cam-like protruding portion 14*e* adapted to be engaged by the end portion 13*b* of the lever 13.

Also mounted on the shaft 1, and freely rotatable relative thereto, is a spacer 19 having a tubular extension 19*a* freely received inside the hubs 7*a* and 13*a* of the parts 7 and 13 respectively, and a gear 8 having left-hand and right-hand tubular extensions 8*a* and 8*b* respectively, the former abutting against the spacer 19 and the latter being telescopably received inside the fine tuning shaft 2. The tubular extension 8*b*, where it is received inside the fine tuning shaft 2, is provided with a slot 8*c* through which a pin 2*b* carried by the fine tuning shaft 2 is adapted to be received, as a result of which the fine tuning shaft 2 is axially movable along the tubular extension 8*b* to the extent permitted by the slot 8*c*, yet rotation of the fine tuning shaft 2 is transmitted to the gear 8. A biasing compression spring is 15 is on the tubular extension 8*b* and is compressed between the gear 8 and the fine tuning shaft 2, thereby to resiliently urge the fine tuning shaft 2 to the right as viewed in the drawings. The fine tuning shaft 2 is provided with a radially extending cam 2*a* of frustroconical shape.

Figure 3:
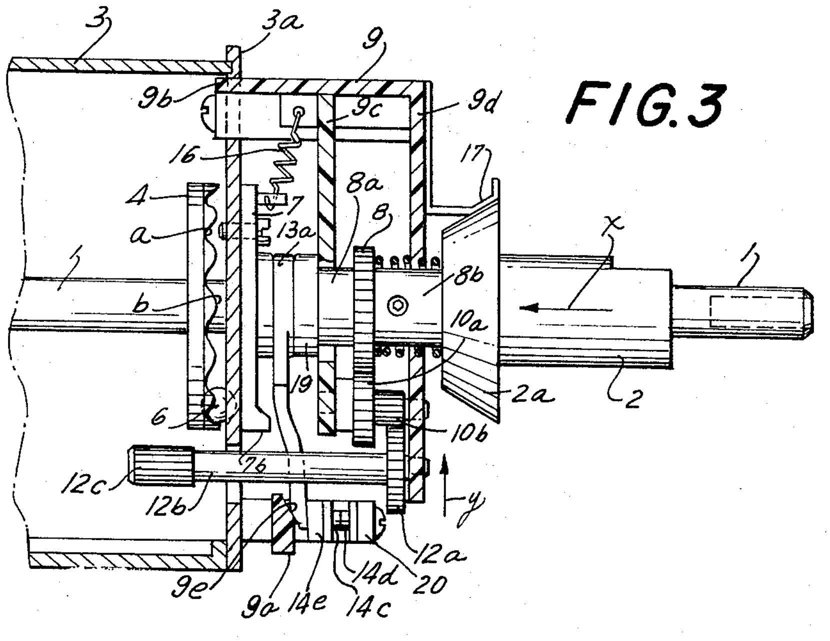
FIG. 3 is a view similar to FIG. 2 but showing the fine-tuner-actuated mechanism and illustrating the parts in the position which they assume for actuating the AFC defeat switch when the fine tuning means is enabled.
Figure 4:
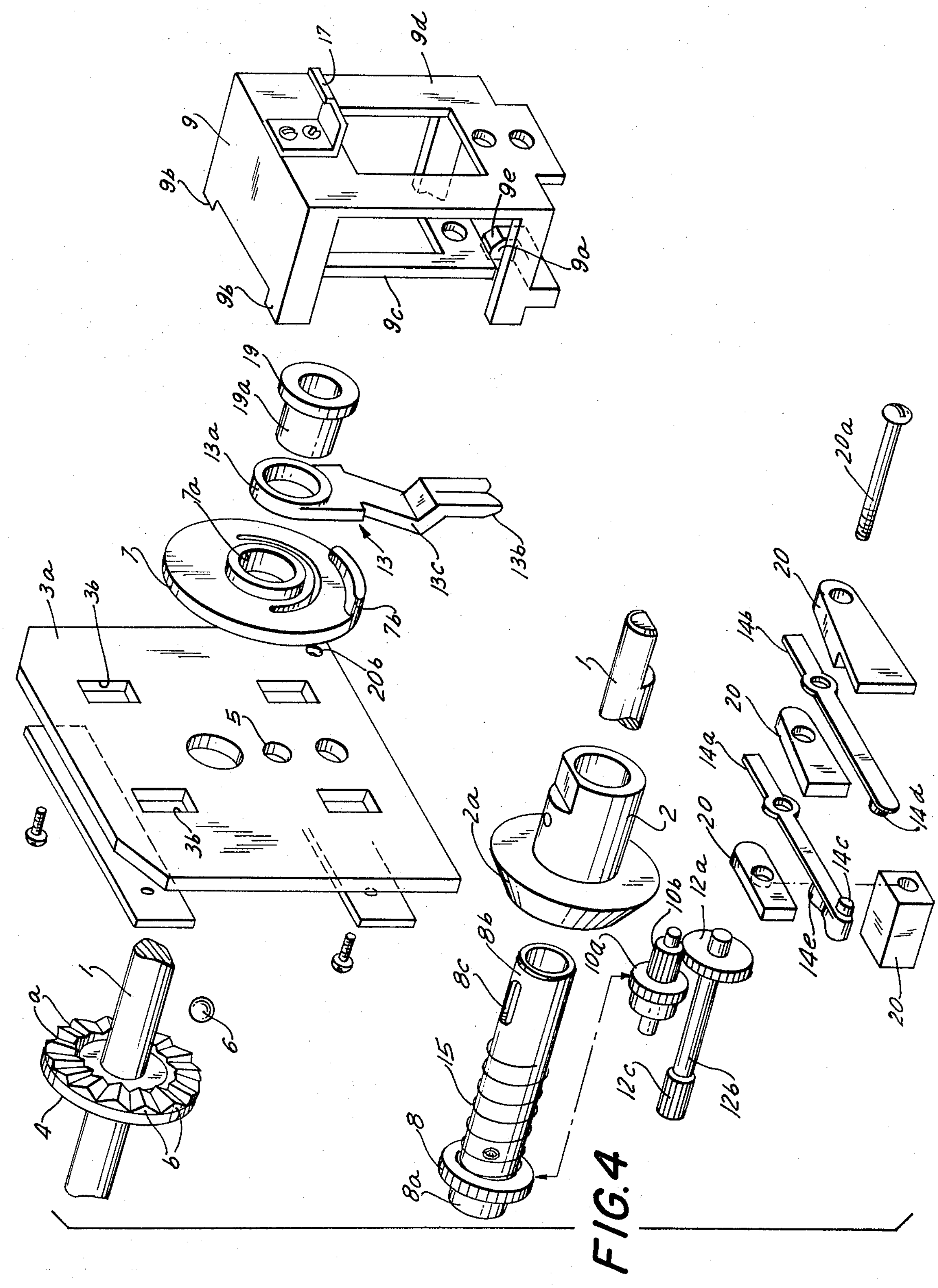
FIG. 4 is a three-quarter perspective exploded view of the individual parts of the mechanism.

Mounted on the frame end plate 3*a* for vertical movement is a frame 9, that frame 9 having legs 9*b* slidably received in slots 3*b* in the end plate 3*a*. A tension spring 16 is active between the frame 9 and a lug 3*c* on the end wall 3*a* so as to resiliently urge the frame 9 downwardly. The frame 9 is provided with walls 9*c* and 9*d*, a pair of gears 10*a* and 10*b* being rotatably mounted between the walls 9*c* and 9*d* so as to rotate with one another, the gear 10*b* meshing with gear 12*a* also journalled on the wall 9*d*, the gear 12*a* being fast on shaft 12*b* which extends to the tuning mechanism 11 and there carries pinion 12*c*. The gear 10*a* is mounted in line with the gear 8 but, when the frame 9 is in its down position as shown in FIG. 1, is spaced from the gear 8 so as not to be in mesh therewith. However, whenever the fine tuning shaft 2 is moved inwardly, as indicated by the arrow X in FIG. 3, the frusto-conical cam 2*a* carried thereby will engage with the cam follower 17 carried by the frame 9, thereby to move the frame 9 upwardly, as indicated by the arrow Y in FIG. 3, which brings gear 10*a* into mesh with gear 8 so that subsequent rotation of the fine tuning shaft 2 will cause the pinion 12*c* to rotate. When the frame 9 moves up in that fashion pinion 12*c* will be moved up with it into engagement with some suitable tuning gear in the tuning mechanism 11, as is well known, so that rotation of the pinion 12*b* will actuate the fine tuning mechanism.

The frame 9 carries a projecting part 9*a* with an inclined cam surface 9*c*. As may be seen from FIG. 1, when the frame 9 is in its lower position, to which it is urged by the spring 16, engagement between the cam surface 9*e* and the end portion 13*b* of the operative lever 13 is such as to permit that operative lever 13 to assume its non-switch-actuating position. However, as may be seen from FIG. 3, when the frame 9 moves upwardly the part 9*a* moves up with it and cams the operating lever 13 into its switch-actuating position, causing the contacts 14*c* and 14*d* to engage, thereby to disable or defeat the AFC circuit. It is not necessary that the cam surface 9*e* engage the operating lever 13 over its entire width; it is sufficient if the engagement is such as merely to cause the operating lever 13 to twist about its axis (rather than to bend along its axis, as it does when it is actuated by the resilient means 7). However, it is entirely within the concept of this invention for the operating arm 13 to move in the same sense, whether it be twisting or bending, for actuation by the channel selector means or by the fine tuning means. Similarly, although the operating lever is here disclosed as itself being resilient, that being a preferred construction, it is within the scope of the invention to utilize equivalent arrangements involving at least some parts which are not resilient.

From the above it will be appreciated that what is here disclosed is a very compact and simple mechanism for actuating an AFC defeat switch both when the channel selector means is actuated and when the fine tuning means is actuated. The frame 9 forms a part of the fine tuning means which must be provided in any event, even if the AFC defeat switch were not provided, and similarly the detent member 4 and the resilient means comprising the plate 7 and the ball 6 must be provided for the channel selector means whether the AFC defeat switch is provided or not. The only additional part, other than the defeat switch 14 itself, is the operating lever 13, and it is so designed and arranged that its incorporation into the tuner adds nothing or virtually nothing to the space required. Actuation of the AFC defeat switch is positive and reliable,, the mechanical arrangement is simple in the extreme, and is of very low cost.

While but a single embodiment of the present invention has been here specifically disclosed, it will be apparent that many variations may be made therein, all within the spirit of the invention defined by the following claims.

I claim:

1. Apparatus for deactuating the AFC circuit in a tuner or the like of the type having a housing, a channel selector shaft movably mounted on said housing, a detent member having recesses and raised portions thereon, said member being mounted on said channel selector shaft for movement therewith, an element adjacent said detent member and movable thereby between a first position and a second position as it rides into said recesses and over said raised portions respectively, a fine tuning shaft movably mounted on said housing, switch means mounted on said housing, said switch means comprising a pair of switch contacts at least one of which is relatively movable with respect to the other between a first position wherein the contacts engage each other and a second position wherein said contacts are disengaged, said switch means being connected to the AFC circuit to deactuate the AFC circuit when said contacts are in said first position, said apparatus comprising first and second resilient members at least one of which is mounted on said housing, said first resilient member being interposed between said element and said second resilient member, a portion of said second resilient member being adjacent one of said contacts so as to move said contacts between said first and said second positions as said element moves between said second position and said first position respectively, means connected to said fine tuning shaft and slidably mounted on said housing for movement relative thereto as said fine tuning shaft is moved, said slidable means having a cam surface thereon, said second resilient member having a cam follower surface thereon adjacent said cam surface, said slidable means being movable between a normal position wherein said cam surface does not cause said second resilient member to move said contacts to the first position and a displaced position wherein said cam surface causes said second resilient member to move said contacts to said first position.

* * * * *